United States Patent
Sasahara et al.

[11] Patent Number: 5,735,973
[45] Date of Patent: Apr. 7, 1998

[54] PRINTED CIRCUIT BOARD SURFACE PROTECTIVE AGENT

[75] Inventors: Yasumichi Sasahara, Tokorozawa; Takao Ohno, Hannoh; Seiji Shibata, Iruma, all of Japan

[73] Assignee: Tamura Kaken Corporation, Saitama, Japan

[21] Appl. No.: 170,049

[22] Filed: Dec. 20, 1993

[51] Int. Cl.$^6$ .................. C23F 11/14; C23F 11/10
[52] U.S. Cl. .................. 148/269; 148/274; 106/14.16; 548/304.4
[58] Field of Search .................. 548/304.4; 148/269, 148/274; 106/14.16

[56] References Cited

FOREIGN PATENT DOCUMENTS

| | | |
|---|---|---|
| 428383 | 5/1991 | European Pat. Off. |
| 551112 | 7/1993 | European Pat. Off. |
| 46-17046 | 5/1971 | Japan |
| 46-34214 | 10/1971 | Japan |
| 3-124395 | 5/1991 | Japan |
| 3236478 | 10/1991 | Japan |
| 480375 | 3/1992 | Japan |
| 4183874 | 6/1992 | Japan |
| 525407 | 2/1993 | Japan |
| 5-93281 | 4/1993 | Japan |
| 593280 | 4/1993 | Japan |
| 598474 | 4/1993 | Japan |
| 5186880 | 7/1993 | Japan |
| 5186888 | 7/1993 | Japan |

OTHER PUBLICATIONS

Sasahara et al. (CA 120:137258f), @1994.
Sasahara et al. (CA 120:137286p), @1994.
Yoshioka et al. (CA 120:206406s), @1994.
Yoshioka et al., CA 117: 238370 (1992).

*Primary Examiner*—Johann Richter
*Assistant Examiner*—Laura L. Stockton
*Attorney, Agent, or Firm*—Felfe & Lynch

[57] ABSTRACT

Described herein is a printed circuit board surface protective agent containing compounds as expressed by Formula I.

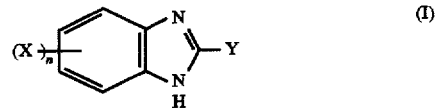

(herein, Y is a linear or a branched alkyl group having 1 to 20 carbon atoms or (2)

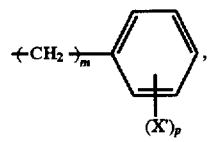

X is any of halogen atom, amino group, di-lower alkylamino group, hydroxy group, lower alkoxy group, cyano group, formyl group, acetyl group, benzoyl group, carbamoyl group, carboxyl group, lower alkoxycarbonyl group, or nitro group; X' is any of alkyl group, halogen atom, amino group, di-lower alkylamino group, hydroxy group, lower alcoxy group, cyano group, formyl group, acetyl group, benzoyl group, carbamoyl group, carboxyl group, lower alkoxycarbonyl group or nitro group; n is an integral number from 1 to 4, and X may be either identical or different when n is in a range from 2 to 4. m is an integral number in a range from 1 to 10, p is 0 or an integral number in a range from 1 to 4, and X' may be either identical or different when p is in a range from 2 to 4.)

6 Claims, No Drawings

PRINTED CIRCUIT BOARD SURFACE PROTECTIVE AGENT

BACKGROUND OF THE INVENTION

1. Field of the Invention

The present invention relates to a printed circuit board surface protective agent, and more particularly to a printed circuit board surface protective agent which has an excellent effect for preventing oxidation of or generation of rust on a surface of a printed circuit board metal under a high temperature.

Especially the present invention relates to a printed circuit board surface protective agent containing compounds as expressed by Formula I.

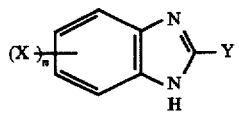

(I)

(herein, Y is a linear or a branched alkyl group having 1 to 20 carbon atoms or

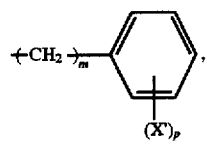

X is any of halogen atom, amino group, di-lower alkylamino group, hydroxy group, lower alkoxy group, cyano group, formyl group, acetyl group, benzoyl group, carbamoyl group, carboxyl group, lower alkoxycarbonyl group, or nitro group; X' is any of alkyl group, halogen atom, amino group, di-lower alkylamino group, hydroxy group, lower alkoxy group, cyano group, formyl group, acetyl group, benzoyl group, carbamoyl group, carboxyl group, lower alkoxycarbonyl group or nitro group; n is an integral number from 1 to 4, and X may be either identical or different when n is in a range from 2 to 4. m is an integral number in a range from 1 to 10, p is 0 or an integral number in a range from 1 to 4, and X' may be either identical or different when p is in a range from 2 to 40.

2. Description of the Prior Art

Conventionally a metal plate comprising copper or copper alloy has generally been used to form a circuit on a surface of a printed circuit board, and a method of protecting the surface of a printed circuit board is largely divided into a resin coating method, a solder coating method, and a chemical coating method. In the resin coating method, generally such material as resins or synthetic resins are dissolved in an organic solvent and is applied on the entire surface of a printed circuit board with such a tool as roller or brush, or by means of dipping or spraying, and is then dried to form a coat. In the solder coating method, a surface of a printed circuit board with a circuit formed thereon is protected by thinly coating the surface with melted solder. In the resin coating method described above, solution of resin dissolved by an organic solvent is used, so that sometimes workers may be poisoned or a fire may occur due to evaporation or dispersion of the organic solvent, which is very disadvantageous from viewpoints of sanitation and environment. Also the solder coating method is excellent in a sense that a printed circuit board processed by this method is well protected from a high temperature or in a high humidity, but a thickness of solder coat formed by means of solder coating is not homogeneous, so this method is unsuitable to the high density packaging of parts on printed circuit boards. Also the cost required to coating solder is rather expensive, which is disadvantageous in mass production for industrial purposes. In order to eliminate the defects as described above, a rust-proof coat protecting method with a chemical has been developed. And a rust prevention method for copper and copper alloy using an imidazole derivative as a chemical for rust prevention has been disclosed (in Japanese Patent Publication No. 17046/1971 and Japanese Patent Publication No. 34214/1971). However, the chemicals have a defect of poor solderability under a high temperature and a high humidity.

So a benzoimidazole derivative has been disclosed as a protective agent to solve even the defect described above in the following patent publications; Japanese Patent Laid Open No. 124395/1991 disclosing a preflux for soldering containing

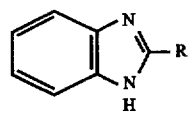

(R: H or an alkyl group having 1 to 17 carbon atoms) and

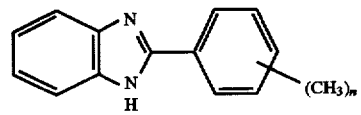

(n: 0 to 3), Japanese Patent Laid Open No. 236478/1991 disclosing a surface processing agent for copper or copper alloy containing

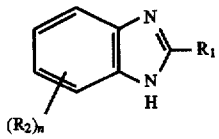

($R_1$: Alkyl group having 3 to 17 carbon atoms, $R_2$: lower alkyl group, n: 1 to 2), and

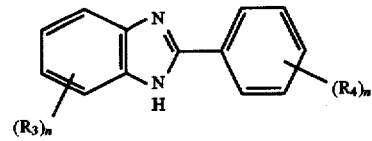

($R_3$; $R_4$: Lower alkyl group, n: 0 to 1), Japanese Patent Laid Open No. 186880/1993 disclosing a printed circuit board production method wherein preflux processing is performed on copper or copper alloy using

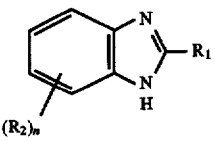

($R_1$: H, alkyl group having 3 to 17 carbon atoms, $R_2$: H, —$CH_3$ , n: 0 to 3), or

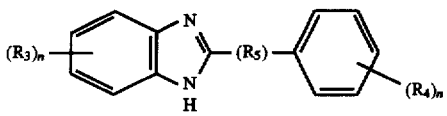

($R_3$, $R_4$: H, alkyl group having 1 to 6 carbon atoms, $R_5$: H, alkyl group having 0 to 7 carbon atoms, n: 0 to 3), Japanese Patent Laid Open No. 93280/1993 disclosing a method for processing metal surface with a preflux solution containing

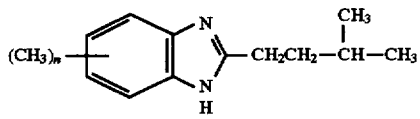

(n: 0 to 3), Japanese Patent Laid Open No. 93281/1993 disclosing a method for processing metal surface with a preflux solution containing

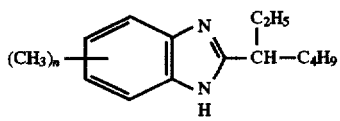

(n: 0 to 3), Japanese Patent Laid Open No. 98474/1993 disclosing a method for processing surface with a preflux solution containing

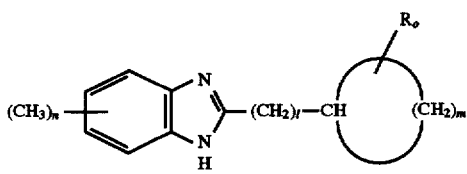

(R: alkyl group having 0 to 3 carbon atoms, O: 0 to 4, n: 0 to 3, l: 0 to 4, m: 2 to 7).

SUMMARY OF THE INVENTION

With a protective agent containing the conventional type of benzimidazole derivative as described above as a main component, it has been becoming more and more difficult to correspond to ever-increasingly higher density in parts fixed as well as in surface mount devices. Also it is difficult to achieve an adequate rust prevention effect when a printed circuit board attached to a hardening furnace or a reflowing furnace is to be exposed to a high temperature for prolonged hours, not only the time of soldering.

An object of the present invention is to provide a new protective agent for a printed circuit board containing a substituted benzimidazole derivative as a main component which can fully be effective under the conditions as described above.

The inventors made serious efforts to finding out a protective agent which is fully effective even under very severe processing conditions for production of printed circuit boards as described above and as a result found out that a substituted benzimidazole derivative expressed by Formula I and its salt can satisfy the requirement, thus accomplished the present invention.

The present invention provides a surface protective agent for printed circuit boards containing the compound expressed by Formula I as an effective component.

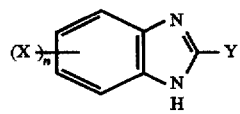

(herein, Y is a linear or branched alkyl group having 1 to 20 carbon atoms or

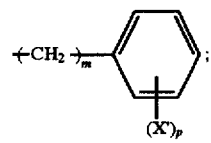

X is any of halogen atom, amino group, di-lower alkylamino group, hydroxy group, lower alkoxy group, cyano group, formyl group, acetyl group, benzoyl group, carbamoyl group, carboxyl group, lower alkoxycarbonyl group or nitro group; X' is alkyl group, halogen atom, amino group, di-lower alkylamino group, hydroxy group, lower alkoxy group, cyano group, formyl group, acetyl group, benzoyl group, carbamoyl group, carboxyl group, lower alkoxycarbonyl group or nitro group; n is an integral number from 1 to 4, and X may be either identical or different when n is in a range from 2 to 4. m is an integral number from 1 to 10, p is 0 or an integral number from 1 to 4, and X' may be either identical or different when p is in a range from 2 to 4.)

DETAILED DESCRIPTION OF THE INVENTION

The compound expressed by Formula I which is an effective component of a protective agent according to the present invention is any of, but not limited thereto:

5,6-dichloro-2-n-hexylbenzimidazole,
6-diethylamino-2-n-decylbenzimidazole,
6-hydroxy-2-n-eicosabenzimidazole,
4,7-dicyano-2-n-octylbenzimidazole,
6-nitro-2-ethylbenzimidazole,
6-ethoxy-2-isopropylbenzimidazole,
6-amino-2-isooctylbenzimidazole,
4,6-diacetyl-2-isobutylbenzimidazole,
4-benzoyl-6-carbamoyl-2-n-propylbenzimidazole,
4,7-dimethoxycarbonyl-2-n-eicosabenzimidazole,
6-methoxycarbonyl-2-isopropylbenzimidazole,
4,5-dimethyl-7-acetyl-2-hexylbenzimidazole,
4-chloro-6-n-heptyl-7-methoxy-2-ethylbenzimidazole,
4,6-difluoro-5-formyl-2-n-nonylbenzimidazole,
6-carbamoyl-4,7-diethoxy-2-isobutylbenzimidazole,
4-chloro-2-(3-phenylpropyl) benzimidazole,
6-dimethylamino-2-(9-phenylnonyl) benzimidazole,
4,7-dihydroxy-2-benzylbenzimidazole,
4-cyano-2-(6-phenylhexyl) benzimidazole,
5,6-dinitro-2-benzylbenzimidazole,
4,7-diethoxy-2-(2-phenylethyl) benzimidazole,
6-amino-2-(4-phenylbutyl) benzimidazole,
6-cetyl-2-benzylbenzimidazole,
4-benzoyl-2-(5-phenylpentyl) benzimidazole,
6-carbamoyl-2-(7-phenylheptyl) benzimidazole,
6-ethoxycarbonyl-2-benzylbenzimidazole,
4,5,6-trimethoxy-2-(2-phenylethyl) benzimidazole,
5,6-dimethyl-7-benzoyl-2-(3-phenylpropyl) benzimidazole, 4,5-dichloro-6-n-butyl-2-(9-phenylnonyl) benzoimidazole, 4-fluoro-6-formyl-2-benzylbenzimidazole, 6-carbamoyl-5-ethoxy-2-(10-phenyldecyl) benzimidazole, 5,6-dimethy-2-{(4-methoxyphenyl) butyl} benzimidazole, 6-chloro-2-{(2-nitrophenyl) ethyl} benzimidazole, 6-carboethoxy-2-(3-bromobenzyl) benzimidazole, 4-hydroxy-2-{(4-cyanophenyl) propyl} benzimidazole, 6-dimethylamino-2-{(4-formylphenyl) propyl} benzimidazole, 6-benzoyl-2-{(4-tert-butylphenyl) ethyl} benzimidazole, 2-{(2-acetylphenyl) pentyl} benzimidazole, 6-carbamoyl-2-{(2,4-dihydroxyphenyl) ethyl} benzimidazole.

For using the compound expressed by Formula I which is an effective component as a printed circuit board surface protective agent according to the present invention, it is convenient to dissolve or emulsify the compound in water or a aqueous solvents which can be mixed with water at any mixing ratio.

The compound expressed by Formula I is generally not water-soluble, so it is better to form a salt of this compound with an inorganic acid or an organic acid for ob taining an easier-to-use protective agent. Acids which can be used for forming the salt include organic acids such as formic acid, acetic acid, propionic acid, butylic acid, glycolic acid, lactic acid, chloroacetic acid, dichloroacetic acid, trichloroacetic acid, bromoacetic acid, dibromoacetic acid, fluoroacetic acid, difluoroacetic acid, trifluoroacetic acid, oxalic acid, malonic acid, succinic acid, adipic acid, malic acid, tartaric acid, citric acid, maleic acid, fumaric acid, para-toluensulfonic acid, and methanesulfonic acid, and inorganic acids such as chloric acid, sulfuric acid, phosphoric acid, phosphorous acid, diphosphorous acid, and nitric acid. Also the solvents which can be mixed with water at any mixing ratio include methanol, ethanol, isopropanol, acetone, methyl ethyl ketone, tetrahydrofuran, dioxane, dimethyl sulfoxide, and dimethylformamide, and these solvents may be mixed, as occassion calls, in the protective agent according to the present invention.

The content of an effective component contained in the present solution or in the emulsion is in a range from 0.05 to 30 weight %, and preferably in a range from 0.1 to 5 weight %. It should be noted that, when the effective component content is less than 0.05 weight %, an adequate effect of protection can not be provided even by applying the present agent on a printed circuit board, and also that, when the content is more than 30 weight %, insoluble substances gain in number, which is also economically disadvantageous.

In addition to the above-described effective components, it is preferable to add in the printed circuit board protective agent, according to the present invention, such heavy metal-salts as, copper formate, copper chloride, copper oxalate, copper acetate, copper phosphate, copper sulfate, copper formate, manganese formate, manganese chloride, or manganese sulfate, as a complex-coat forming and promoting agent for of instance, of copper.

Furthermore, an additive, which is normally added, may be added to the protective agent used for other purposes within a scope of the present invention, if it was necessary.

In the method of forming a protective film with the protective agent according to the present invention on a printed circuit board, like in the common coating method, a surface of a copper circuit on a printed circuit board is mechanically or chemically polished, and then the printed circuit board is dipped in a solution of the protective agent according to the present invention. Dipping may be carried out under a temperature range from 0° to 60° C., and preferably under a temperature range from 10° to 50° C. The time for dipping is in a range from 5 sec to 1 hour, and preferably in a range from 10 sec to 10 minutes.

It should be noted that the protective agent may also be applied by means of spraying or by using such a tool as a brush or a roller.

Solderability of the coat thus obtained is extremely excellent even stored in a high temperature and high humidity.

DESCRIPTION OF THE PREFERRED EXAMPLES

A description is made hereinafter for preferred examples of the present invention and the effects thereof.

Example 1

0.1 g of copper sulfate, 1.0 g of 5,6-dichloro-2-n-hexylbenzimidazole, and 0.1 g of 25% aqueous ammonia were successively added in 100 g aqueous solution of 2 (weight) % tartaric acid, the mixture was well agitated, and aqueous solution of 5,6-dichloro-2-n-propylbenzimidasole was obtained.

Test pieces of 30.0 mm×7.5 mm×0.3 mm copper plates each having a cleaned surface upon polishing, degreasing, soft-etching and water-washing were dipped in the said solution for 2 minutes under a temperature of 50° C. After the coating, the test pieces were washed off with water and dried with hot air, and then thermally degraded for 5, 10, 15 and 20 minutes respectively under a temperature of 200° C., thereupon a soldering-flux was applied before measuring, then, a solder wettability test (wetting balance method) was carried out according to JIS-C-0053. Also a solder spreading factor test was carried out according to JIS-Z-3197. The results are shown in Table 1, and results of solder wettability test (wetting balance method) as well as of solder spreading factor test performed after in 0, 100, 200, 500 and 1,000 hours under a relative humidity of 90% and a temperature of 40° C. under the same conditions as those employed in the previous tests are shown in Table 2.

Example 2

25 g of ethanol and 10 g of 6-diethylamino-2-n-decylbenzimidazole were added to 75 g of 3 (weight) % tartaric acid aqueous solution, the mixture was well agitated, and 6-diethylamino-2-n-decylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 3

25 g of ethanol and 1.0 g of 6-hydroxy-2-n-eicosabenzimidazole were added to 75 g of 3 (weight) 5 tartaric acid aqueous solution, the mixture was well agitated, and 6-hydroxy-2-n-eicosabenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 4

0.1 g of manganese formate and 1.0 g of 4,7-dicyano-2-n-octylbenzimidazole were added to 100 g of 2 (weight) % tartaric acid aqueous solution, the mixture was well agitated, and 4,7-dicyano-2-n-octylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 5

0.1 g of manganese formate and 1.0 g of 6-nitro-2-n-ethylbenzimidazole were added to 100 g of 2 (weight) % of tartaric acid aqueous solution, the mixture was well agitated, and 6-nitro-2-n-ethylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 6

1.0 g of 4,6-diacetyl-2-isobutylbenzimidazole was added to 100 g of 2 (weight) % tartaric acid aqueous solution, and 4,6-diacetyl-2-isobutylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 7

1.0 g of 4-chloro-2-(3-phenylpropyl) benzimidazole was added to 2 (weight) % tartaric acid aqueous solution, the mixture was well agitated, and 4-chloro-2-(3-phenylpropyl) benzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 8

25 g of ethanol and 10 g of 6-dimethyl-2-(9-phenylnonyl) benzimidazole were added to 75 g of 3 (weight) % of tartaric acid aqueous solution, the mixture was well agitated, and 6-dimethyl-2-(9-phenylnonyl) benzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 9

1.0 g of 4,7-dihydroxy-2-benzylbenzimidazole was added to 100 g of 3 (weight) % tartaric acid aqueous solution, the mixture was well agitated, and 4,7-dihydroxy-2-benzylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 10

0.1 g of manganese formate and 1.0 g of 4-cyano-2-(6-phenylhexyl) benzimidazole were added to 100 g of 2 (weight) % tartaric acid aqueous solution, the mix ture was well agitated, and 4-cyano-2-(6-phenylhexyl) benzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 11

0.1 g of manganese formate and 1.0 g of 5,6-dinitro-2-benzylbenzimidazole were added to 100 g of 2 (weight) % tartaric acid aqueous solution, the mixture was well agitated, and 5,6-dinitro-2-benzylbenzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 12

1.0 g of 4,7-diethoxy-2-(2-phenylethyl) benzimidazole was added to 100 g of 2 (weight) % tartaric acid aqueous solution, and 4,7-diethoxy-2-(2-phenylethyl) benzimidazole aqueous solution was obtained.

The test pieces similar to those in Example 1 were dipped in the solution, and the solder wettability test (wetting balance method) and the solder spreading factor test under the same conditions as in Example 1 as well as the tests under a high humidity were carried out. The results are shown in Table 1 and Table 2.

Example 13

0.1 g of copper sulfate, 1.0 g of 6-chloro-2-{(2-nitrophenyl) ethyl} benzimidazole, and 0.1 g of 25% aqueous ammonia were successively added to 100 g of 2 (weight) % tartaric acid aqueous solution, the mixture was well agitated, and 6-chloro-2-{(2-nitrophenyl) ethyl} benzimidazole aqueous solution was obtained.

This solution was tested using the same test pieces as those used in Example 1 under the same conditions. The results are shown in Table 1 and Table 2.

Example 14

0.1 g of copper sulfate, 1.0 g of 6-carboxyethoxy-2-(3-bromobenzyl) benzimidazole, and 0.1 g of 25% aqueous ammonia were successively added to 100 g of 2 (weight) % tartaric aqueous solution, the mixture was well agitated, and 6-carboxyethoxy-2-(3-bromobenzyl) benzimidazole aqueous solution was obtained.

This solution was tested using the same test pieces as those used in Example 1 under the same conditions. The results are shown in Table 1 and Table 2.

Example 15

0.1 g of copper sulfate, 1.0 g of 4-hydroxy-2-{(4-cyanophenyl) propyl} benzimidazole, 0.1 g of 25% aqueous ammonia were successively added to 100 g of 2 (weight) % tartaric acid aqueous solution, the mixture was well agitated, and 4-hydroxy-2-{(4-cyanophenyl) propyl} benzimidazole aqueous solution was obtained.

This solution was tested using the same test pieces as those used in Example 1 under the same conditions. The results are shown in Table 1 and Table 2.

Example 16

0.1 g of copper sulfate, 1.0 g of 6-dimethylamino-2-{(4-formylphenyl) propyl} benzimidazole, and 0.1 g of 25% aqueous ammonia were successively added to 100 g of 2 (weight) % tartaric acid aqueous solution, the mixture was well agitated, and 6-dimethylamino-2-{(4-formylphenyl) propyl} benzimidazole aqueous solution was obtained.

This solution was tested using the same test pieces as those used in Example 1 under the same conditions. The results are shown in Table 1 and Table 2.

Example 17

0.1 g of copper sulfate, 1.0 g of 6-benzoyl-2-{(4-tert-butylphenyl) ethyl} benzimidazole, and 0.1 g of 25% aqueous ammonia were successively added to 100 g of 2 (weight) % tartaric acid aqueous solution, the mixture was well agitated, and 6-benzoyl-2-{(4-tert-butylphenyl) ethyl}benzimidazole aqueous solution was obtained.

This solution was tested using the same test pieces as those used in Example 1 under the same conditions. The results are shown in Table 1 and Table 2.

Example 18

0.1 g of copper sulfate, 1.0 g of 2-{(2-acetylphenyl) pentyl} benzimidazole, and 0.1 g of 25% aqueous ammonia were successively added to 100 g of 2 (weight) % tartaric acid aqueous solution, the mixture was well agitated, and 2-{(2-acetylphenyl) pentyl} benzimidazole aqueous solution was obtained.

This solution was tested using the same test pieces as those used in Example 1 under the same conditions. The results are shown in Table 1 and Table 2.

Example 19

0.1 g of copper sulfate, 1.0 g of 6-carbamoyl-2-{(2,4-dihydroxyphenyl) ethyl} benzimidazole, and 0.1 g of 25% aqueous ammonia were successively added to 100 g of 2 (weight) % tartaric acid aqueous solution, the mixture was well agitated, and 6-carbamoyl-2-{(2,4-dihydroxyphenyl) ethyl} benzimidazole aqueous solution was obtained.

This solution was tested using the same test pieces as those used in Example 1 under the same conditions. The results are shown in Table 1 and Table 2.

Example for Comparison 1

In place of 5,6-dichloro-2-n-hexylbenzimidazole used in Example 1, the same quantity of 4-methyl-2-undecylimidazole was added to, and 4-methyl-2-n-undecylimidazole aqueous solution was obtained, thereupon, test pieces similar to those used in Example 1 were dipped in the solution for 30 sec under a room temperature. The solder wettability test (wetting balance method) and the solder spreading factor test were performed for the test pieces thus obtained under the same conditions as in Example 1 as well as under a high humidity. The results are shown in Table 1 and Table 2.

Example for Comparison 2

1 g of benzimidazole and 2 g of acetic acid were put into a 300 ml beaker and the mixture was agitated until the matters were dissolved. Then 100 g of water, 0.05 g of copper chloride, and 0.5 g of aqueous ammonia were put into the beaker and dissolved under a liquid temperature of 50° C., and 1 (weight) % benzimidazole aqueous solution was obtained. The test pieces similar to those used in Example 1 were dipped in this solution, and the solder wettability test (wetting balance method) and the solder spreading factor test were performed under the same conditions as in Example 1 as well as under a high temperature. The results are shown in Table 1 and Table 2.

TABLE 1

| Test conditions | Examples | | | | | | | | | | |
|---|---|---|---|---|---|---|---|---|---|---|---|
| | 1 | 2 | 3 | 4 | 5 | 6 | 7 | 8 | 9 | 10 | 11 |
| Solder wetting time (Sec) | | | | | | | | | | | |
| Before thermal degradation | 0.10 | 0.23 | 0.25 | 0.27 | 0.24 | 0.15 | 0.11 | 0.13 | 0.24 | 0.27 | 0.21 |
| 200° C./5 minutes | 0.21 | 0.40 | 0.37 | 0.33 | 0.37 | 0.27 | 0.21 | 0.25 | 0.33 | 0.31 | 0.31 |
| 200° C./10 minutes | 0.47 | 0.87 | 0.71 | 0.51 | 0.61 | 0.55 | 0.55 | 0.66 | 0.70 | 0.55 | 0.59 |
| 200° C./15 minutes | 1.03 | 1.38 | 1.07 | 0.90 | 0.95 | 0.98 | 0.99 | 1.11 | 0.99 | 1.01 | 0.99 |
| 200° C./20 minutes | 1.57 | 2.51 | 1.47 | 1.27 | 1.30 | 1.63 | 1.88 | 1.98 | 1.33 | 1.35 | 1.15 |
| Solder spreading factor (%) | | | | | | | | | | | |
| Before thermal degradation | 95.0 | 95.1 | 94.7 | 94.4 | 94.0 | 94.9 | 94.1 | 95.0 | 95.0 | 93.3 | 94.1 |
| 200° C./5 minutes | 94.8 | 95.1 | 94.2 | 94.2 | 93.8 | 94.6 | 93.7 | 94.5 | 94.0 | 92.9 | 93.9 |

TABLE 1-continued

|  | | | | | | | | | | | |
|---|---|---|---|---|---|---|---|---|---|---|---|
| 200° C./10 minutes | 92.3 | 94.2 | 93.7 | 93.7 | 92.5 | 93.5 | 93.2 | 93.1 | 93.9 | 91.5 | 93.0 |
| 200° C./15 minutes | 91.9 | 93.7 | 93.0 | 92.7 | 91.7 | 92.3 | 91.0 | 92.1 | 93.1 | 90.8 | 90.9 |
| 200° C./20 minutes | 90.1 | 92.1 | 92.5 | 91.5 | 90.0 | 92.0 | 89.5 | 88.7 | 91.9 | 89.7 | 90.0 |

| Test conditions | Examples | | | | | | | | Examples for comparison | |
|---|---|---|---|---|---|---|---|---|---|---|
|  | 12 | 13 | 14 | 15 | 16 | 17 | 18 | 19 | 1 | 2 |
| Solder wetting time (Sec) | | | | | | | | | | |
| Before thermal degradation | 0.17 | 0.16 | 0.14 | 0.20 | 0.24 | 0.17 | 0.16 | 0.13 | 0.23 | 0.24 |
| 200° C./5 minutes | 0.27 | 0.26 | 0.20 | 0.26 | 0.29 | 0.25 | 0.27 | 0.20 | 2.71 | 1.49 |
| 200° C./10 minutes | 0.66 | 0.58 | 0.60 | 0.71 | 0.68 | 0.50 | 0.64 | 0.47 | 8.01 | 3.33 |
| 200° C./15 minutes | 1.00 | 1.63 | 1.03 | 1.25 | 1.00 | 0.93 | 0.88 | 0.69 | >10.00 | 7.99 |
| 200° C./20 minutes | 1.47 | 2.75 | 1.77 | 2.33 | 1.45 | 1.09 | 1.15 | 0.95 | >10.00 | >10.00 |
| Solder spreading factor (%) | | | | | | | | | | |
| Before thermal degradation | 94.1 | 93.9 | 94.3 | 95.0 | 95.0 | 95.1 | 95.0 | 94.8 | 94.7 | 94.5 |
| 200° C./5 minutes | 93.3 | 93.8 | 94.0 | 94.7 | 94.1 | 94.9 | 94.7 | 94.1 | 92.0 | 93.9 |
| 200° C./10 minutes | 92.1 | 92.7 | 93.1 | 92.7 | 92.9 | 93.8 | 93.9 | 93.2 | 63.1 | 89.0 |
| 200° C./15 minutes | 90.9 | 92.3 | 90.9 | 90.5 | 90.1 | 92.1 | 92.9 | 92.7 | 45.5 | 71.0 |
| 200° C./20 minutes | 87.1 | 91.1 | 89.9 | 88.0 | 90.0 | 91.5 | 92.0 | 92.1 | 38.9 | 67.8 |

TABLE 2

| Test conditions 40° C./90% relative humidity | Examples | | | | | | | | | | |
|---|---|---|---|---|---|---|---|---|---|---|---|
|  | 1 | 2 | 3 | 4 | 5 | 6 | 7 | 8 | 9 | 10 | 11 |
| Solder wetting time (Sec) | | | | | | | | | | | |
| 0 hour(s) | 0.10 | 0.23 | 0.25 | 0.27 | 0.24 | 0.15 | 0.10 | 0.27 | 0.24 | 0.29 | 0.24 |
| 100 | 0.13 | 0.22 | 0.25 | 0.29 | 0.25 | 0.16 | 0.15 | 0.29 | 0.33 | 0.35 | 0.27 |
| 200 | 0.19 | 0.25 | 0.27 | 0.33 | 0.29 | 0.21 | 0.20 | 0.33 | 0.39 | 0.46 | 0.31 |
| 500 | 0.22 | 0.29 | 0.30 | 0.37 | 0.35 | 0.28 | 0.21 | 0.35 | 0.45 | 0.67 | 0.41 |
| 1000 | 0.24 | 0.31 | 0.33 | 0.41 | 0.39 | 0.35 | 0.26 | 0.41 | 0.31 | 0.70 | 0.55 |
| Solder spreading factor (%) | | | | | | | | | | | |
| 0 hour(s) | 95.0 | 95.1 | 94.7 | 94.4 | 94.0 | 94.9 | 95.1 | 95.0 | 95.0 | 94.5 | 94.1 |
| 100 | 95.1 | 95.1 | 94.7 | 94.4 | 93.9 | 94.8 | 95.2 | 94.7 | 94.6 | 94.6 | 94.1 |
| 200 | 94.3 | 94.0 | 94.0 | 94.0 | 93.0 | 94.5 | 94.1 | 94.0 | 94.1 | 93.7 | 94.0 |
| 500 | 93.9 | 94.7 | 93.1 | 92.7 | 92.7 | 94.1 | 93.9 | 94.3 | 93.5 | 93.0 | 93.9 |
| 1000 | 93.3 | 93.0 | 92.5 | 91.9 | 92.5 | 93.4 | 93.8 | 94.0 | 93.0 | 90.9 | 93.7 |

| Test conditions 40° C./90% relative humidity | Examples | | | | | | | | Examples for comparison | |
|---|---|---|---|---|---|---|---|---|---|---|
|  | 12 | 13 | 14 | 15 | 16 | 17 | 18 | 19 | 1 | 2 |
| Solder wetting time (Sec) | | | | | | | | | | |
| 0 hour(s) | 0.24 | 0.16 | 0.13 | 0.19 | 0.23 | 0.15 | 0.16 | 0.14 | 0.23 | 0.24 |
| 100 | 0.27 | 0.16 | 0.15 | 0.19 | 0.25 | 0.15 | 0.18 | 0.18 | 0.49 | 0.66 |
| 200 | 0.41 | 0.27 | 0.20 | 0.23 | 0.30 | 0.13 | 0.17 | 0.23 | 0.99 | 1.11 |
| 500 | 0.52 | 0.30 | 0.39 | 0.33 | 0.34 | 0.20 | 0.25 | 0.31 | 1.53 | 1.79 |
| 1000 | 0.66 | 0.33 | 0.66 | 0.41 | 0.35 | 0.37 | 0.41 | 0.51 | 2.01 | 2.63 |
| Solder spreading factor (%) | | | | | | | | | | |
| 0 hour(s) | 94.1 | 94.0 | 94.3 | 95.1 | 95.1 | 94.9 | 94.8 | 94.8 | 94.7 | 94.5 |
| 100 | 93.7 | 93.8 | 94.0 | 95.0 | 95.2 | 94.8 | 94.9 | 94.0 | 93.0 | 94.5 |
| 200 | 92.5 | 93.5 | 93.9 | 94.8 | 95.0 | 94.0 | 93.5 | 92.7 | 93.5 | 94.0 |
| 500 | 91.4 | 93.0 | 93.5 | 94.0 | 94.1 | 92.0 | 93.0 | 91.9 | 93.0 | 93.9 |
| 1000 | 89.9 | 92.9 | 93.2 | 93.9 | 93.7 | 91.9 | 90.9 | 90.9 | 91.9 | 92.8 |

As clearly shown by the results described above, the solder wetting time of the protective agent according to the present invention was shortened with comparison to that of the protective agent in examples, and also the effects for rust prevention and the solder wetting time under a high humidity were excellent.

Thus, the printed circuit board surface protective agent according to the present invention can provide a high heat resistance on the surface of copper or copper alloy on a circuit of the printed circuit board and form an extremely excellent coat even after exposed to a high humidity, thereupon, it is a very useful invention for protection of a printed circuit board as well as for solderability after parts are fixed.

What is claimed is:

1. A printed board surface protective agent comprising a compound as expressed by Formula I

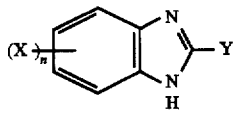

wherein Y is a linear or a branched alkyl group having 1 to 20 carbon atoms or

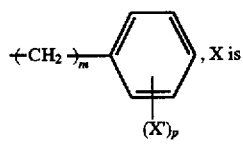

any of amino group, di-lower alkylamino group, hydroxy group, lower alkoxy group, cyano group, formyl group, acetyl group, benzoyl group, carbamoyl group, carboxyl group, or lower alkoxycarbonyl group, X' is any of alkyl group, halogen atom, amino group, di-lower alkylamido group, hydroxy group, lower alkoxy group, cyano group, formyl group, acetyl group, benzoyl group, carbamoyl group, carboxyl group, lower alkoxycarbonyl group or nitro group; n is an integral number from 1 to 4, and X may be either identical or different when n is in a range from 2 to 4, m is an integral number in a range from 1 to 10, p is 0 or an integral number in a range from 1 to 4, and X' may be either identical or different when p is in a range from 2 to 4.

2. The printed circuit surface protective agent of claim 1, wherein the effective ingredient is an aqueous solution of a salt of a chemical compound of Formula 1.

3. A printed board surface protective agent comprising a compound as expressed by Formula II

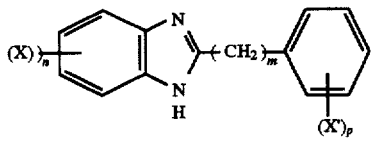

wherein X is any of halogen atom, amino group, di-lower alkylamido group, hydroxy group, lower alkoxy group, cyano group, formyl group, acetyl group, benzoyl group, carbamoyl group, carboxyl group, lower alkoxycarbonyl group or nitro group; X' is any of halogen atom, amino group, di-lower alkylamido group, hydroxy group, lower alkoxy group, cyano group, formyl group, acetyl group, benzoyl group, carbamoyl group, carboxyl group, lower alkoxycarbonyl group or nitro group; n is an integral number from 1 to 4, and X may be either identical or different when n is in a range from 2 to 4, m is an integral number in a range from 1 to 10, p is an integral number in a range from 1 to 4, and X' may be either identical or different when p is in a range from 2 to 4.

4. The printed circuit surface protective agent of claim 3, wherein the effective ingredient is an aqueous solution of a salt of a chemical compound shown by Formula II.

5. A printed board surface protective agent comprising a compound of Formula I:

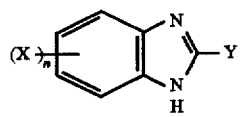

wherein Y is

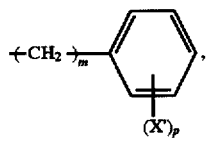

X is any of amino group, di-lower alkylamino group, hydroxy group, lower alkoxy group, cyano group, formyl group, acetyl group, benzoyl group, carbamoyl group, carboxyl group, or lower alkoxycarbonyl group, X' is any of alkyl group, halogen atom, amino group, di-lower alkylamido group, hydroxy group, lower alkoxy group, cyano group, formyl group, acetyl group, benzoyl group, carbamoyl group, carboxyl group, lower alkoxycarbonyl group, or nitro group; n is an integral number from 1 to 4, and X may be either identical or different when n is in a range from 2 to 4, m is an integral number in a range from 1 to 10, p is o or an integral number in a range from 1 to 4, and X' may be either identical or different when p is in a range from 2 to 4.

6. The printed circuit surface protective agent of claim 5, wherein the effective ingredient is an aqueous solution of a salt of a chemical compound shown by Formula I.

* * * * *